(12) United States Patent
Summerer et al.

(10) Patent No.: US 6,590,657 B1
(45) Date of Patent: Jul. 8, 2003

(54) SEMICONDUCTOR STRUCTURES AND MANUFACTURING METHODS

(75) Inventors: Christian Summerer, Munich (DE); Shahid Butt, Ossining, NY (US); Gerhard Kunkel, Fishkill, NY (US); Uwe Paul Schroeder, Fishkill, NY (US)

(73) Assignee: Infineon Technologies North America Corp., Cupertino, CA (US)

( * ) Notice: Subject to any disclaimer, the term of this patent is extended or adjusted under 35 U.S.C. 154(b) by 0 days.

(21) Appl. No.: 09/408,246

(22) Filed: Sep. 29, 1999

(51) Int. Cl.[7] .............................................. G01B 11/00
(52) U.S. Cl. ....................................... 356/401; 430/322
(58) Field of Search ................................. 356/401, 400, 356/73, 237; 430/322; 438/401; 250/461.1

(56) References Cited

U.S. PATENT DOCUMENTS

| 4,744,663 A | * | 5/1988 | Hamashima et al. ........ 356/375 |
| 5,969,428 A | * | 10/1999 | Nomura et al. ............. 257/797 |
| 5,981,150 A | * | 11/1999 | Aoki et al. .................. 430/322 |
| 6,083,806 A | * | 7/2000 | Mancini et al. ............. 438/401 |

* cited by examiner

Primary Examiner—Frank G. Font
Assistant Examiner—Layla Lauchman
(74) Attorney, Agent, or Firm—Daly, Crowley & Mofford, LLP

(57) ABSTRACT

A semiconductor body having an alignment mark comprising a material adapted to absorb impinging light and to radiate light in response to the absorption of the impinging light, such radiated light being radiated with a wavelength different from the wavelength of the impinging light. Also a method and apparatus for detecting an alignment mark on a semiconductor body. The method and apparatus successively scan an alignment illumination comprising the impinging light over the surface of the semiconductor surface and over the alignment mark. The impinging energy is reflected by the surface of the semiconductor when such impinging light is over and is reflected by the surface of the semiconductor. The impinging energy is absorbed by the material and is then radiated by the material when such impinging energy is scanned over such material. The reflected light is selectively filtered while the radiated light is passed to a detector.

4 Claims, 2 Drawing Sheets

FIG. 4
PRIOR ART
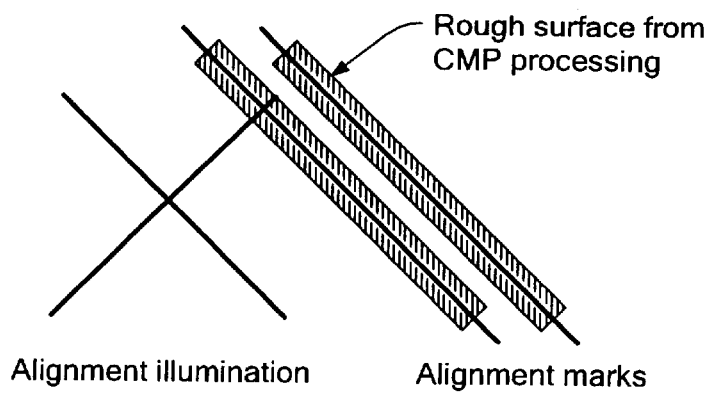
Alignment illumination    Alignment marks
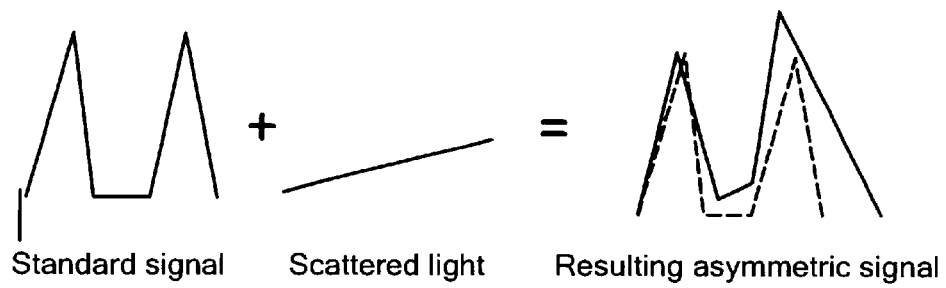
Standard signal    Scattered light    Resulting asymmetric signal
FIG. 5
PRIOR ART
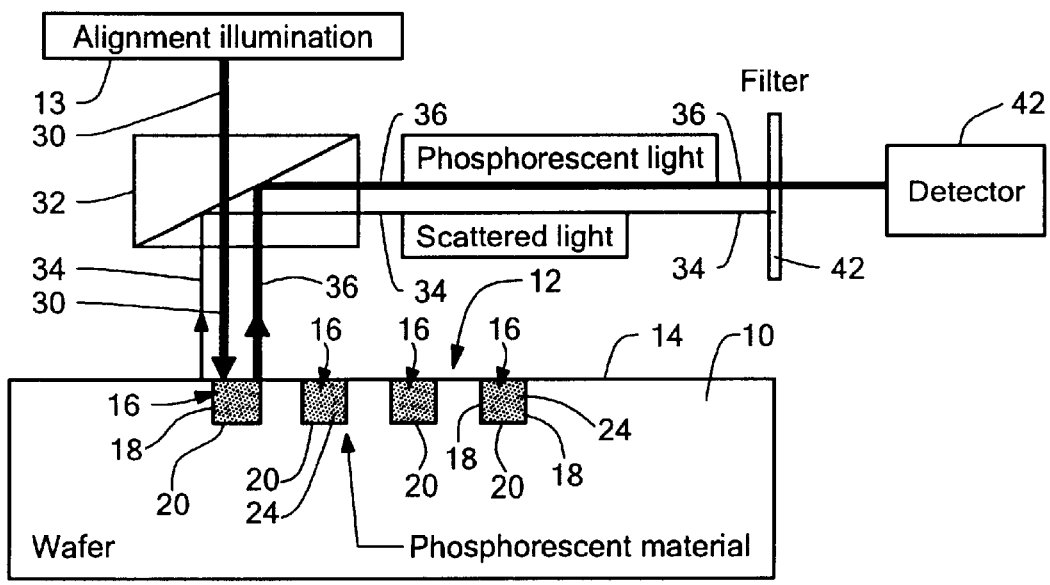
FIG. 6

SEMICONDUCTOR STRUCTURES AND MANUFACTURING METHODS

BACKGROUND OF THE INVENTION

This invention relates generally to semiconductor structures and manufacturing methods and more particularly to alignment techniques used therein.

As is known in the art, semiconductor integrated circuits are manufactured using a series of process steps which require proper alignment of the semiconductor wafer. Present alignment systems use reflected light from profile patterns formed on the surface of the semiconductor wafer to determine the location of the wafer. Such an arrangement is shown in FIG. 1. An alignment illumination is focused onto the surface of the semiconductor wafer using an optical system. A portion of the alignment illumination is reflected from the surface of the semiconductor wafer is directed by the optical system to a detector. The wafer has formed along one portion thereof an alignment mark, here shown diagrammatically as a series of grooves etched into the surface of the wafer. As the wafer is moved horizontally, the detector produces a waveform such as that shown in FIGS. 2 and 3. The determining factor for alignment quality, or alignment repeatability, is the accuracy by which the alignment structure can be located. This accuracy is mainly determined by two factors: Signal to Noise Ratio; and, Processing influenced shift in the apparent alignment mark position. An insufficient signal to noise ratio of the alignment mark can be caused by stray light from the surface of the wafer due to process related (mostly chemical mechanical processing) roughness and high absorption of the reflected light by layers of material covering the alignment marks, such as anti-reflection coatings and photoresist. FIG. 2 shows a detector produced waveform where there is a relatively low signal to noise ratio and FIG. 3 shows a detector produced waveform with a relatively high signal to noise ratio. A processing influenced shift in the apparent position of the alignment mark can, for example, be caused by an effect known as "unintended chevrons". This effect may be understood with reference to FIG. 4. As shown in FIG. 4, the alignment illumination projected by the optical system (FIG. 1) onto the surface of the wafer is a cross, such as used in the MICRASCAN equipment manufactured by Silicon Valley Group (SVG), San Jose, Calif. The alignment marks etched into the surface of the wafer are shown in FIG. 4 as a pair orthogonal sets of a series of parallel lines, only one of the two sets being shown in FIG. 4. The detector includes a pair of orthogonally positioned detector elements, one aligned with one arm of the alignment illumination cross and the other aligned with the other arm of the alignment illumination. As the alignment illumination is scanned along the X-axis in the presence of ideal alignment marks, the waveform produced by the optical system is a "standard signal shown in FIG. 5 for one of the pair of orthogonal alignment marks, such "standard signal" being a series of triangular shaped pulses are produced by the detector aligned with one of the pair of alignment mark arms. More particularly, when the arm of the alignment illumination is over the arm of the alignment mark which is parallel to the arm of the alignment illumination, there is a peak in the output of the detector aligned with the arm of alignment illumination. However, because of scattered light from the "roughened" surface adjacent to the alignment marks, caused by, for example, chemical mechanical processing, a shift in the apparent position of the alignment marks occur. More particularly, as noted above, the alignment mark detectors are positioned to receive only light scattered perpendicular to the alignment mark. The system is designed such that +45 degree component of the alignment illumination should not contribute to the signal shown in FIG. 5. However, due to the scattering of light from the roughened surface, the +45 degree component contributes an inhomogeneous light background. This alignment mark detector output signal becomes asymmetric, resulting in distortion of the perceived alignment mark location. In the example shown in FIG. 5, light is reflected into the detector resulting in an apparent shift to the left of position in the alignment mark because the peaks have shifted somewhat to the left.

SUMMARY OF THE INVENTION

In accordance with the present invention, a semiconductor body is provided having an alignment mark comprising a material adapted to absorb impinging light and to radiate light in response to the absorption of the impinging light, such radiated light being radiated with a wavelength different from the wavelength of the impinging light.

With such semiconductor body, instead of detecting light reflected from an alignment mark formed in the surface of the semiconductor body, a detection system may be provided which detects energy emitted by the material used to provide the mark, such emitted light being distinguishable from the reflected light by the difference in wavelength of the reflected and emitted light. Thus, better alignment quality is achieved because of reduced background noise (i.e., filtering stray light reflected by imperfections in the surface of the semiconductor body) and reduced process influenced shifts.

In accordance with another feature of the invention, a method is provided for detecting an alignment mark on a semiconductor body. The method includes providing the alignment mark comprising a material. The material is adapted to absorb impinging light and to radiate light in response to the absorption of the impinging light, such radiated light being radiated with a wavelength different from the wavelength of the impinging light. An alignment illumination comprising the impinging light is successively scanned over the surface of the semiconductor surface and over the alignment mark. The impinging energy is reflected by the surface of the semiconductor when such impinging light is over and is reflected by the surface of the semiconductor. The impinging energy is absorbed by the material and is then radiated by the material when such impinging energy is scanned over such material. The reflected light is selectively filtered while the radiated light is passed to a detector.

In accordance with still another feature of the invention, apparatus is provided for detecting an alignment mark on a semiconductor body. The alignment mark is provided in a surface portion of the body. The surface of the semiconductor body is adapted to reflect light energy impinging on such surface with a predetermined wavelength. The mark comprises a material adapted to absorb the impinging light and to radiate light in response to the absorption of the impinging light and to radiate light with a wavelength different from the wavelength of the impinging light. The apparatus includes an optical system for scanning an alignment illumination comprising the impinging light successively over the surface of the semiconductor surface and over the alignment mark. The impinging energy is reflected by the surface of the semiconductor when such impinging light is over and reflected by the surface of the semiconductor and such impinging energy being absorbed and then radiated by the material on the alignment mark when such impinging energy is scanned over such material. The system includes a filter having a relatively high transmissivity to the radiated light and a relatively low transmissivity to the reflected light. The filter is disposed in the path of the reflected and radiated light. A detector is disposed to receive portions of the reflected and radiated light transmitted through the filter.

BRIEF DESCRIPTION OF THE DRAWINGS

These and other features of the invention will become more readily apparent from the following detailed description when read together with the following drawings, in which:

FIG. 4 is a diagrammatical sketch showing an alignment mark of the system of FIG. 1 projected on the semiconductor of FIG. 1 having an alignment mark according to the prior ART;

FIG. 5 is a sketch showing the effect of scattered light from an alignment mark of FIG. 4 on a waveform produced by the optical system of FIG. 1;

FIG. 6 is an alignment system according to the invention shown being used with a semiconductor having an alignment mark according to invention.

DESCRIPTION OF THE PREFERRED EMBODIMENTS

Figure 1:
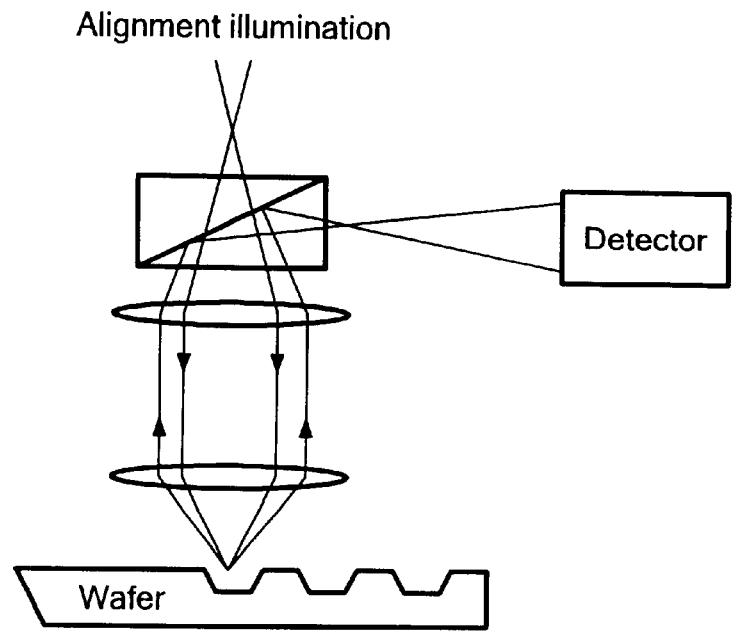
FIG. 1 is an alignment system shown being used with a semiconductor having an alignment mark according to the PRIOR ART.
Figure 2:
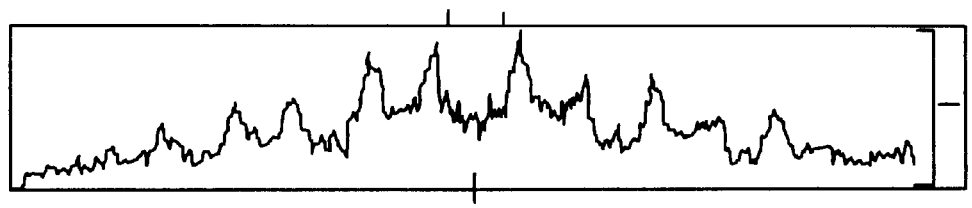
FIGS. 2 and 3 are waveforms produced by the system of FIG. 1 when such system is used with semiconductor having an alignment mark according to the PRIOR ART.
Figure 3:
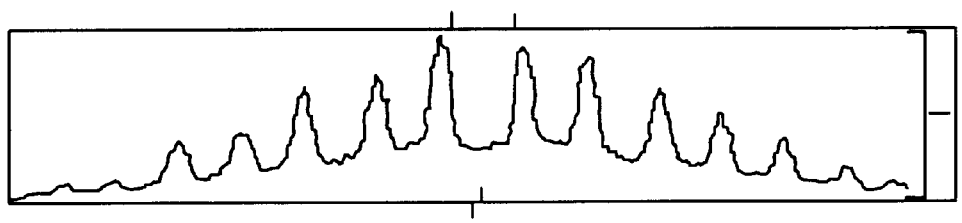

Referring now to FIG. 6, a semiconductor body 10, here a single crystal silicon body is shown having formed thereon an alignment mark 12. The alignment mark 12 is formed in a portion of the surface 14 of the semiconductor body 10. The surface 14 of the semiconductor body is adapted to reflect light energy from an alignment illumination 13 impinging on such surface 14 with a predetermined wavelength. The alignment mark 12 includes grooves 16 having sidewalls 18 terminating at the surface 14 of the semiconductor body 10. The grooves 16 have bottom portions 20 recessed below the surface 14 of the semiconductor body 10. The alignment mark 12 includes a material 24 disposed on the bottom portions 20 of the grooves 16. The material 24 is adapted to absorb the impinging light from the alignment illumination and to radiate light in response to the absorption of the impinging light with radiated light being radiated with a wavelength different from the wavelength of the impinging light. For example, such material may be a phosphorescent material, such as, for example, fluorescene which absorbs light at approximately at a wavelength of 485 nanometers (NM) and emits, or radiates, light at approximately a wavelength of 530 nm.

Thus, in FIG. 6, the incident light from the alignment illumination is shown by beam 30, it being noted that such incident light passes through a prism 32. The reflected light from such beam 30 from the surface 14 of the semiconductor body 10 is shown by beam 34, and includes scattered light. The light radiated by the material 24 is shown by beam 36, such being phosphorescent light. Both beams 34 and 36 (i.e, the scattered light having the wavelength of the alignment illumination and the light radiated by the material 24) have, as noted above, different wavelengths. The beams 34 and 36 pass to a detector 40 through a spatial filter 42. The filter 42 is selected to absorb light energy at the wavelength of the alignment illumination (i.e., the energy in beam 34) and to pass energy at the wavelength of the radiated light (i.e., the energy in beam 36). Thus, the detector 40 responds to the energy from the alignment mark 12 since the energy reflected (i.e., scattered) from the surface 14 of the semiconductor body 10 is rejected by filter 42 and prevented, or significantly attenuated by the filter, from passing to the detector 40.

Other phosphorescent materials may be used such as neodymium or erbium.

Other embodiments are within the spirit and scope of the appended claims.

What is claimed is:

1. A semiconductor body, comprising:
   an alignment mark in a surface of semiconductor material of the semiconductor body, such mark comprising a material adapted to absorb impinging light and to radiate light in response to the absorption of the impinging light, such radiated light being radiated with a wavelength different from the wavelength of the impinging light.

2. A method for detecting an alignment mark in a semiconductor body, comprising:
   providing the alignment mark in a surface of semiconductor material of the semiconductor body comprising a material, such material being adapted to absorb impinging light and to radiate light in response to the absorption of the impinging light, such radiated light being radiated with a wavelength different from the wavelength of the impinging light;
   scanning an alignment illumination comprising the impinging light successively over the surface of the semiconductor surface and over the alignment mark, such impinging energy being reflected by the surface of the semiconductor when such impinging light is over and reflected by the surface of the semiconductor and such impinging energy being absorbed and then radiated by the material when such impinging energy is scanned over such material;
   selectively filtering the reflected light while passing the radiated light; and
   detecting the portions of the light passed by the filter.

3. The semiconductor body recited in claim 1 wherein the alignment mark comprises grooves in the surface of the semiconductor material of the body and wherein the absorbing material is disposed in the grooves.

4. The method recited in claim 2 wherein the providing the alignment mark comprises forming grooves in the semiconductor material of the semiconductor body and disposing the absorbing material in the formed groves.

* * * * *